United States Patent [19]

Equi et al.

[11] Patent Number: 4,939,623
[45] Date of Patent: Jul. 3, 1990

[54] MODEM WITH IMPROVED TRANSFORMER ASSEMBLY

[75] Inventors: John E. Equi, Huntsville; Lelton C. Woodham, Arab; John M. Butler, Huntsville, all of Ala.

[73] Assignee: Universal Data Systems, Inc., Huntsville, Ala.

[21] Appl. No.: 342,823

[22] Filed: Apr. 25, 1989

[51] Int. Cl.⁵ .................... H05K 7/06; H01F 15/02
[52] U.S. Cl. ............................ 361/399; 336/65; 336/92; 336/107; 336/198; 361/400
[58] Field of Search ............ 361/334, 380, 395, 399, 361/400, 417, 419; 336/65, 92, 105, 107, 198, 208

[56] References Cited

U.S. PATENT DOCUMENTS

| | | | |
|---|---|---|---|
| 2,823,360 | 2/1958 | Jones | 336/65 |
| 3,134,467 | 5/1964 | Blyth | 336/65 X |
| 3,191,135 | 6/1965 | Hazelquist | 361/419 X |
| 3,371,302 | 2/1968 | Mas | 336/92 |
| 3,391,384 | 7/1968 | Hughes | 336/92 X |
| 4,012,672 | 3/1977 | Douglass et al. | 336/92 X |
| 4,519,015 | 5/1985 | Lin | 336/92 X |
| 4,652,975 | 3/1987 | Scott | 336/65 X |
| 4,811,165 | 3/1989 | Currier et al. | 361/395 |

Primary Examiner—Thomas J. Kozma
Attorney, Agent, or Firm—Charles L. Warren

[57] ABSTRACT

An improved transformer assembly includes a core windings about the core, and a mechanism attached to opposing ends of the core for slideably mounting the assembly to interior edges of a printed circuit board (pcb) which define a recess in the pcb. A further mechanism permits making direct electrical connection between conductors on the printed circuit board and the transformer windings. No additional fasteners or additional soldering is required. This transformer assembly is especially suited for utilization in a modem in order to reduce the thickness of its housing.

19 Claims, 1 Drawing Sheet

MODEM WITH IMPROVED TRANSFORMER ASSEMBLY

BACKGROUND OF THE INVENTION

This invention is directed to an improved transformer assembly with an integral mounting mechanism that directly secures the assembly to a printed circuit board (pcb) without external fasteners. This invention is especially suited for applications in which the thickness of a housing is to be minimized such as in a modem.

A conventional transformer assembly consists of a magnetizable core, primary and secondary windings, and a means for mounting the transformer to a surface. One common mounting means is to utilize a metal strap fixed to the core which includes flanges with holes to accommodate mounting by means of screws to a surface. Another common mounting technique is to directly seat a transformer assembly onto a pcb with electrical jacks extending from an insulating block on the assembly which project through corresponding holes in the pcb. The jacks, which are soldered to conductive runners adjacent the holes, establish electrical connections with the windings of the transformer and serve as a mechanical for holding the transformer to the pcb.

Transformer assemblies such as described above have certain disadvantages. Transformer assemblies which have external mounting requirements such as screws require extra assembly steps during manufacture. Assemblies which are directly soldered by means of jacks to a pcb are often difficult to align and mount to the pcb, and are difficult and time consuming to replace if defective.

SUMMARY OF THE INVENTION

It is an object of the present invention to provide an improved transformer assembly which can be directly and easily mounted to a pcb and removed easily, if desired.

One embodiment according to the present invention includes a transformer assembly having a core and primary and secondary windings mounted to the core. Sliding engagement means are provided at opposing ends of the assembly for releasably mounting it to a pcb. Flanges which are dimensioned to receive the edges of the pcb extend from the assembly and engage interior edges of the pcb to support the assembly. The assembly preferably includes a plurality of spaced apart resilient contacts positioned to slidingly engage conductors on an edge of the pcb so as to establish electrical connections between the transformer windings and the circuitry on the pcb.

A preferred application of the invention includes a modem having a housing and electrical circuitry disposed on a pcb. An improved transformer assembly is mounted to the pcb.

DESCRIPTION OF PREFERRED EMBODIMENTS

Figure 1:
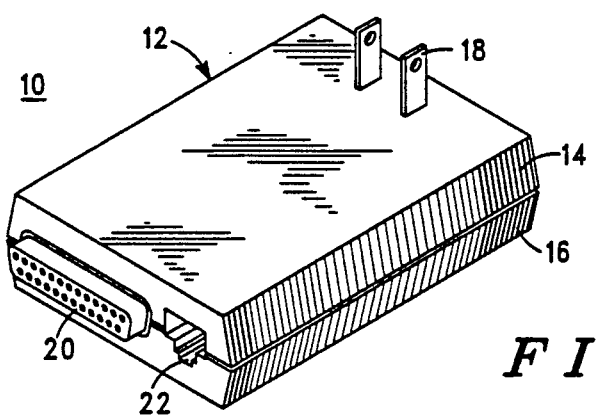
FIG. 1 is a perspective view of a small self contained modem according to the present invention.

Referring to FIG. 1, an embodiment 10 of a data communications device such as a modem according to the present invention includes a clam shell housing 12 which includes halves 14 and 16. A pair of electrical contact blades 18 project from the modem and are positioned for insertion into a conventional AC electrical receptacle to obtain power for the modem. At the rear end of the modem, an RS-232 type plug 20 and modular phone jack receptacle 22 provide means for establishing connections to data terminal equipment, such as a personal computer, and a telephone line, respectively.

Figure 2:
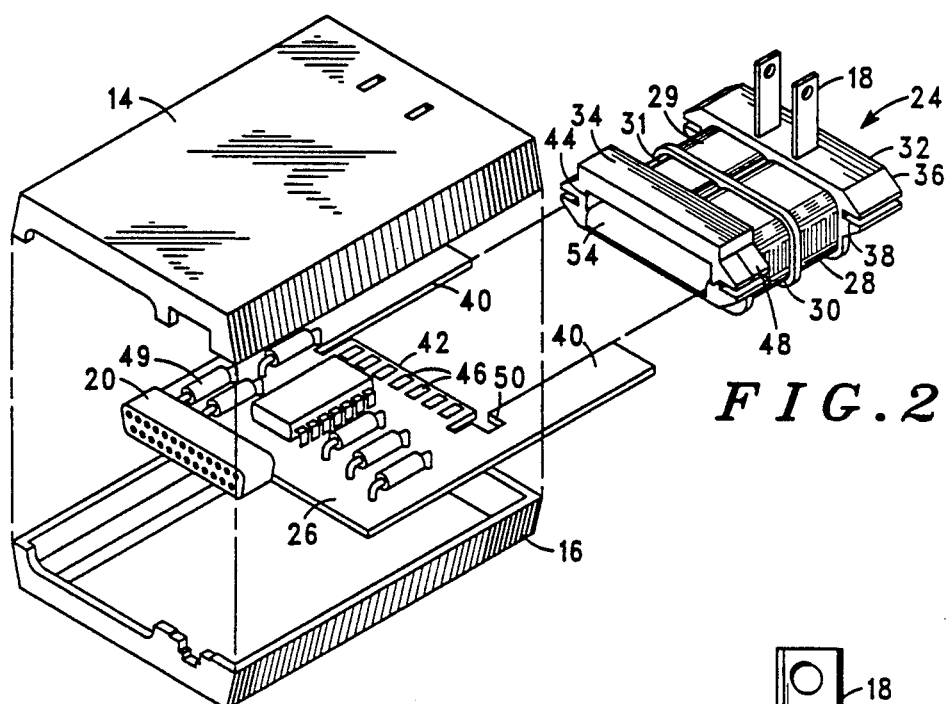
FIG. 2 is an exploded view of the modem of FIG. 1 illustrating an embodiment of a transformer assembly according to the present invention.

FIG. 2 shows an exploded view of modem 10. A transformer assembly 24 is shown aligned for insertion into a recess within a printed circuit board (pcb) 26. The exemplary transformer assembly 24 includes two primary windings 28, 29 and two secondary windings 30, 31. The dual primaries permit operation on either 110 volt or 220 volt AC power. The dual secondaries can be easily configured to provide a center tap arrangement if desired. Although the specific winding and core configuration are not critical to the present invention, the illustrative embodiment is a low profile design. A conventional laminated transformer core is concealed by the windings. The core and windings mounted thereto comprise a core assembly.

Yokes 32 and 34 are mounted to opposing ends of the core assembly. The yokes are constructed of an insulating material such as a plastic and can consist of a unitary structure or may be made from two or more components. Yoke 32 serves to mount AC blades 18 and provides a structure for permitting wires from windings 28, 29 to be attached to these blades. While it is preferred that the connections between the primary windings and blades 18 are made within yoke 32, the winding wires can be directly soldered to the base of the blades outside of the yoke so that no channels within the yoke are needed. Yoke 34 provides means for establishing direct electrical connection with pcb 26 as will be explained later with regard to FIG. 3.

Each yoke preferably has a pair of opposing tabs or flanges 36 which inlcude a recess 38 dimensioned to receive the interior edges 40 of pcb 26. These recesses are preferably dimensioned to snuggly fit the pcb and thereby provide substantial support for the core assembly. The cutout or recess within pcb 26 terminates with edge 42. An opening 44 within yoke 34 is dimensioned to receive edge 42. Edge 42 includes a plurality of electrical conductors 46 which connect the windings of the secondary, and if the transformer primary if desired, with electrical circuitry 49 which includes a power supply and circuitry for transmitting and receiving data on pcb 26. A resilient downwardly biased detent 48 comprises a portion of tab 36 located on one end of yoke 34. This detent is dimensioned to engage recess 50 in the pcb and thus releasably lock the transformer into its operational position.

It should be noted that the pcb 26 can now be located between the substantial portions of the core assembly which projects beyond the major surfaces of the pcb. This minimizes the needed thickness of housing 12.

Figure 3:
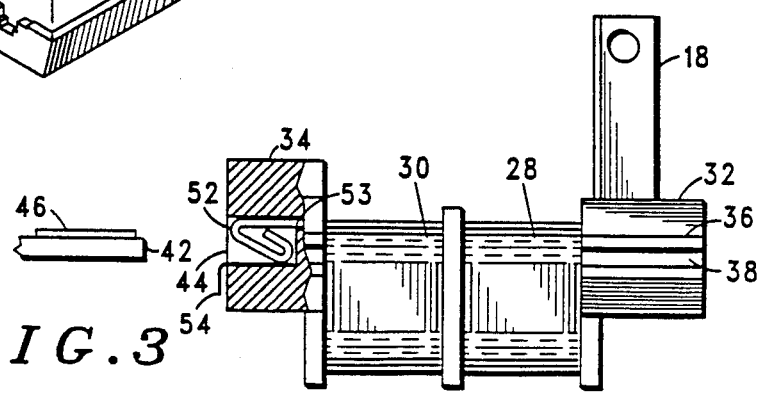
FIG. 3 is a side elevational view of the transformer assembly as shown in FIG. 2.

FIG. 3 shows the transformer assembly and illustrates the means for establishing electrical contact between the windings and the printed circuit board. Within opening 44 in yoke 34 a plurality of spring loaded electrical contacts 52 are dimensioned to engage the spaced apart conductors 46 on pcb 26. These contacts 52 are connected to the individual winding wires of the secondaries 30, 31. As will be apparent, it is also possible to provide connections to primary windings 28, 29 by such contacts instead of utilizing blades 18. The windings preferably consist of conventional wires which can be soldered to portions 53 of contacts 52 remote to the area of engagement. A strip 54 of Mylar or other material having a low coefficient of friction is preferably disposed within opening 44 on the lower surface so as to engage the surface of pcb 26 opposite conductors 46. This material assists in the engagement of the pcb into the opening and serves to minimize the friction between the yoke 34 and the pcb so as to permit the transformer to be withdrawn from its operating position without the use of excessive force.

To remove the transformer assembly, the detent 48 is urged upwardly such as with a flat blade screwdriver, to release the detent from recess 50 and the trasformer is then slid away from edge 42 of the pcb by applying manual force to yoke 34.

Although embodiments of the preferred invention have been described and illustrated in the drawings, the invention is defined by the claims which follow.

What is claimed is:

1. A transformer assembly mounted to a printed circuit board (pcb) having a U-shaped slot extending inward from a perimeter edge comprising:
   a core;
   primary and secondary windings fixed to said core, said core and windings forming a core assembly;
   means attached to opposing ends of said core assembly releasably mounting said core assembly to said pcb, said mounting means slidingly engaging opposing edges of the U-shaped slot on said pcb.

2. The transformer assembly and printed circuit board according to claim 1 wherein said mounting means engage's two opposing interior edges of the U-shaped slot on the pcb.

3. The transformer assembly and printed circuit board according to claim 2 wherein said mounting means comprises flanges extending outwardly beyond said core assembly.

4. The transformer assembly and printed circuit board according to claim 3 wherein said flanges have a slot dimensioned to recieve said edges of the pcb.

5. The transformer assembly and printed circuit board according to claim 1 wherein said mounting means mounts said core assembly so that a substantial portion of said assembly projects beyond both major surfaces of said pcb.

6. The transformer assembly and printed circuit board according to claim 1 further comprising electrical connection means attached to said core assembly slidingly engaging the edge of the pcb that defines the base of the U-shaped slot to establish electrical connection between said windings and pcb conductors adjacent the base of the U-shaped slot.

7. The transformer assembly and printed circuit board according to claim 6 wherein said engaging means comprises spaced apart resilient contacts slidingly engaging the edge of the pcb defining the base of the U-shaped slot.

8. The transformer assembly and printed circuit board according to claim 1 further comprising means attached to said core assembly for making direct electrical connection with an AC electrical outlet thereby permitting AC power to be coupled to said primary winding.

9. A data communications device comprising:
   a housing;
   electrical circuitry disposed on a printed circuit board (pcb) for transmitting and receiving data mounted within said housing, said pcb having a U-shaped slot extending inward from a perimeter edge;
   transformer assembly mounted to said pcb, said assembly comprising:
   a core;
   primary and secondary windings fixed to said core, said core and windings forming a core assembly;
   means attached to opposing ends of said core assembly for releasably mounting said core assembly to said pcb, said mounting means disposed to slidingly engage opposing edges of said U-shaped slot in the pcb.

10. The device according to claim 9 wherein said mounting means is dimensioned to engage said opposing edges of the pcb.

11. The device according to claim 11 wherein said mounting means at each opposing end of the core assembly engages said two opposing edges of the pcb.

12. The device according to claim 10 wherein said mounting means comprises flanges extending outwardly beyond said core assembly.

13. The device according to claim 12 wherein said flanges have a slot dimensioned to receive said opposing edges of the pcb.

14. The device according to claim 9 wherein said mounting means mounts said core assembly so that a substantial portion of said core assembly projects beyond both major surfaces of said pcb.

15. The device according to claim 9 further comprising means attached to said core assembly for directly engaging conductors on said pcb adjacent the base edge of said U-shaped slot to establish electrical connection between said windings and said conductors.

16. The device according to claim 15 wherein said engaging means comprises spaced apart resilient contacts positioned to slidingly engage the edge of the pcb defining the base of said U-shaped slot.

17. The device according to claim 9 further comprising means attached to said core assembly for making direct electrical connection with an AC electrical outlet thereby permitting AC power to be coupled to said primary winding.

18. The transformer assembly and printed circuit board according to claim 5 further comprising electrical connection means attached to said core assembly slidingly engaging the edge of the pcb that defines the base of the U-shaped slot to establish electrical connection between said windings and pcb conductors adjacent to the base of the U-shaped slot.

19. The device according to claim 14 further comprising means attached to said core assembly for directly engaging conductors on said pcb adjacent the base edge of said U-shaped slot to establish electrical connection between said windings and said conductors.

* * * * *

UNITED STATES PATENT AND TRADEMARK OFFICE
CERTIFICATE OF CORRECTION

PATENT NO. : 4,939,623
DATED : July 3, 1990
INVENTOR(S) : John E. Equi et al.

It is certified that error appears in the above-identified patent and that said Letters Patent is hereby corrected as shown below:

In Column 3, line 38, delete "engage's" and insert --engages--.

In Column 3, line 46, delete "recieve" and insert --receive--.

In Column 3, line 50, insert --core-- after "said".

In the Abstract, line 1, insert a --, after "core".

In Column 4, line 25, claim 11 depends on claim 10, not on claim 11.

Signed and Sealed this

Twenty-ninth Day of December, 1992

Attest:

DOUGLAS B. COMER

Attesting Officer

Acting Commissioner of Patents and Trademarks